United States Patent [19]

Zimmer

[11] Patent Number: 5,008,670
[45] Date of Patent: Apr. 16, 1991

[54] PHASE/DIGITAL CONVERSION METHOD AND ARRANGEMENTS FOR IMPLEMENTING THE METHOD

[75] Inventor: Manfred Zimmer, Ulm, Fed. Rep. of Germany

[73] Assignee: Licentia Patent Verwaltungs-GmbH, Frankfurt, Fed. Rep. of Germany

[21] Appl. No.: 331,372

[22] Filed: Mar. 31, 1989

[30] Foreign Application Priority Data

Mar. 31, 1988 [DE] Fed. Rep. of Germany ....... 3811018
Sep. 29, 1988 [DE] Fed. Rep. of Germany ....... 3833005

[51] Int. Cl.$^5$ .............................................. H03M 1/48
[52] U.S. Cl. ...................................... 341/113; 341/111
[58] Field of Search ............... 341/111, 112, 113, 114, 341/115, 116; 332/103; 375/61, 67

[56] References Cited

U.S. PATENT DOCUMENTS

| | | | |
|---|---|---|---|
| 4,613,976 | 9/1986 | Sewerinson et al. | 332/103 |
| 4,726,039 | 2/1988 | Piesinger | 375/67 |
| 4,730,344 | 3/1988 | Saha | 375/67 |
| 4,760,354 | 7/1988 | Kianush | 375/612 |
| 4,812,786 | 3/1989 | Davarian et al. | 332/103 |

OTHER PUBLICATIONS

G. Webber, et al., "DRFM Requirements Demand Innovative Technology", *Microwave Journal*, Feb. 1986, pp. 91–104.

Primary Examiner—A. D. Pellinen
Assistant Examiner—F. L. Williams
Attorney, Agent, or Firm—Spencer & Frank

[57] ABSTRACT

A new method is presented which converts the phases and frequencies of HF and microwave signals into sequences of digital words. This phase quantization is 10 times faster compared to conventional amplitude quantization by means of extremely fast A/D converters. In this method, n parallel shifted signal phases are initially derived from the HF signals by means of a signal phase generator, and in a bank of comparators these signal phases are then converted into rectangular oscillations (sequences). A subsequent digital sampling of these sequences then furnishes the phases of the HF signals as digital values at the output of the circuit.

15 Claims, 8 Drawing Sheets

PHASE/DIGITAL CONVERSION METHOD AND ARRANGEMENTS FOR IMPLEMENTING THE METHOD

CROSS REFERENCE TO RELATED APPLICATION

This application claims the priority of Applications Ser. No. P 38 11 018.0, filed March 31, 1988, and Ser. No. P 38 33 005.9, filed Sept. 29, 1988, in the Federal Republic of Germany, the subject matter of which is incorporated herein by reference.

BACKGROUND OF THE INVENTION

The present invention relates to a phase/digital conversion method as defined in the preamble of claim 1 and to arrangements for implementing the method.

Such methods and arrangements are of importance for the use of digital signal processing and its known advantages with very high frequency signals. In the past, the so-called "digitalization" of high and very high frequencies (f>0.5 GHz) could not be solved in a technically satisfactory manner. However, the demand for such "signal quantizers" (A/D converters) for real time signal processing in satellite radio, satellite television, space travel radio, directional radio, radar and for digital ultrahigh frequency receivers has increased considerably in all commercial and military applications. At present, this trend is decisively supported by the likewise increasing appearance of novel, monolithically integrated microwave circuits (MMIC's) and digital circuits (in gigabit logic) in FaAs-FET and high speed ECL (emitter coupled logic) technology.

In the available fast A/D converters, there appears a separation with respect to resolution (word length) and speed (sampling rate). At present, the limits of the sampling and conversion rates for a word length of $L \leqq 8$ bits lie in a range from 100 MHz to 200 MHz and, for this reason alone, are not applicable for signals in the GHz range (microwave range).

Moreover, these fast A/D converters have a basic drawback resulting from amplitude quantization and their conversion rate is decisively limited by the frequency multiplication effect in the individual active A/D converter components. This effect results from the signal quantization of partially periodical, sawtooth-shaped or ramp-shaped transmission characteristics for binary coded A/D converters and convolution A/D converters. Due to the $2^L$ periods (intervals) of these quantization characteristics, the bandwidth $B_s$ of a bandwidth limited input signal s(t) is increased within the A/D converters to a maximum bandwidth of $$B_{t'} \leqq 2^L \cdot B_s \tag{1}$$

where L = the A/D converter word length in bits if the A/D converters are driven over their full range.

Today, Si-bipolar transistors reach transit frequencies of about 10 GHz. In a roughly calculated example according to Equation (1) for a prior art A/D converter having a word length of L = 8 bits and such transistors, a bandwidth $B_s \leqq 50$ MHz results for an input signal s(t) that can still be converted without errors by the A/D converter.

In contrast thereto, the sampling rate of such an A/D converter can be significantly higher than $2 \cdot B_s = 100$ MHz. However, this does not improve the internal "quantization accuracy" and bandwidth of the A/D converters.

In order to substantially avoid these extreme bandwidth requirements to be met by the individual A/D converter components in the conventional methods for the digitalization of microwaves, principally different methods must be found.

Since the relevant information in most high frequency and microwave signals is contained only in their phase and frequency curves, the customary amplitude quantization can be replaced by a corresponding, equivalent phase quantization. Instead of analog/digital converters, phase/digital converters are then required.

Compared to amplitude digitalization, phase digitalization is possible up to significantly higher frequencies and signal bandwidths.

Reference /3/ describes and compares arrangements and methods for amplitude as well as phase digitalization. Phase/digital conversion is here based on a complex input signal whose in-phase (I) and quadrature (Q) components are fed into combination network. The output signals of the combination network are applied to the inputs of a plurality of comparators whose outputs are again connected with a coder for the generation of binary coded values for the momentary signal phase.

SUMMARY OF THE INVENTION

It is an object of the invention to provide an advantageous phase/digital conversion method and arrangements for implementing this method.

The method according to the invention converts an analog signal to a digital phase form in which an input signal $s(t) = x(t) + jy(t)$ present in the form of orthogonal signal components x(t) and y(t) is converted with the use of a combination network and a plurality of comparators into a digital phase signal at outputs of the comparators. The method includes, for digital phase resolution to $2^N$ identical phase increments $\Theta = 2\pi \cdot 2^{-N}$, forming from the signal components x(t) and y(t) signal phases $\phi_i(t) = a_i \cdot x_i(t) + b_i \cdot y(t)$ ($i = 1, 2, \ldots, 2^{N-1}$) which are shifted in phase by identical phase angles wherein $a_i$ and $b_i$ are weighting coefficients with the relation $b_i/a_i = \tan \Theta_i$ where $\Theta_i = (i-1)\Theta$. The signs of the signal phases are then evaluated with the comparators to obtain digital phase signals $sq_i(t)$, wherein $sq_i(t) = sgn\phi_i(t)$, for i=1, The principle of the method makes available arrangements for implementing the method which arrangements are particularly suitable for monolithic integration on one or a plurality of semiconductor modules. Since the signals put out in parallel at the outputs of the comparators already constitute a digital phase signal (actually a sequence), no analog sampling is required so that sample-and-hold circuits or similar circuits are not needed.

Phase digitalization is particularly advantageous in conjunction with quadrature bandpass systems.

Quadrature systems are used to an increasing degree since they have some technical advantages for digital signal processing compared to single systems. The time function s(t) must be available for signal processing (e.g. filtering, demodulation, etc.) within the system as an "analytic signal". The analytic signal is a complex value resulting, in principle, from the real value signal by cutting off the spectral components at negative frequencies - that is, by a Hilbert transformation. In this case, the minimum sampling rate can be $$f_A \leq B_s \quad (2)$$

Although analytic and complex time signals are physically impossible, it is possible to construct them from two real, mutually orthogonal signals of which the one is interpreted as the real component (in-phase signal) and the other as the imaginary component (quadrature signal).

The complex further processing of the complex bandpass signal $s(t) = x(t) + jy(t)$ can be effected by means of a bandpass filter in the original frequency range (filter bank) or by means of a lowpass filter in the lowpass range. If a lowpass filter is employed, which is of course much less expensive, the spectral component of $S(f)$ within the base band is utilized over the full bandwidth Bs (receiver bank).

BRIEF DESCRIPTION OF THE DRAWING

Embodiments of the invention will now be described in greater detail with reference to the drawing figures.

FIGS. 1(a) and 1(b) show a comparison of quadrature bandpass systems employing in which:

FIG. 1a a conventional amplitude-analog/digital conversion method and;

FIG. 1b a novel phase-digital conversion method.

DETAILED DESCRIPTION OF THE PREFERRED EMBODIMENTS

Figure 1A:
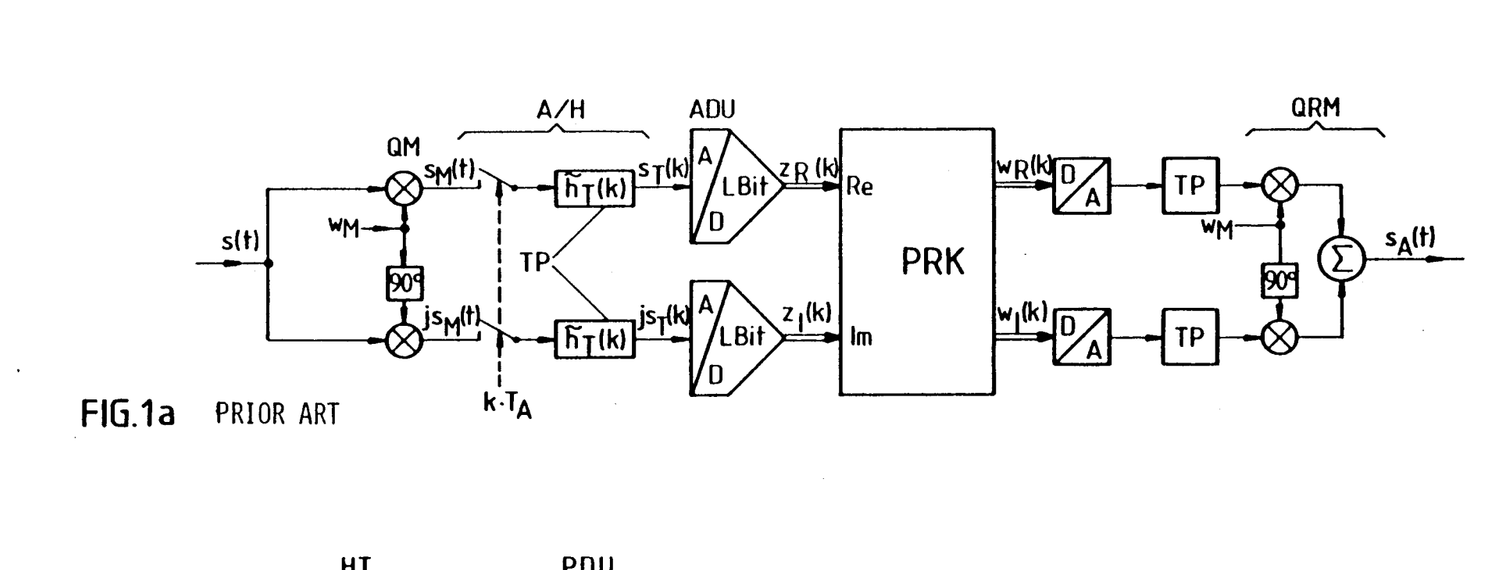

In FIG. 1a, an input signal s(t) is converted in a quadrature mixer arrangement QM for a heterodyne oscillation $w_M$, once directly and once with a 90° shift in phase. The complex mixer output signals ($s_M(t)$ and $js_M(t)$) are sampled in analog in sample-and-hold circuits A/H at the clock pulse of the sampling signal $k \cdot T_A$ and are converted by way of hold circuit lowpass filters TP having a filter function $\bar{h}T(k)$ into analog baseband signal sequences $\bar{s}_T(k)$ and $j\bar{s}_T(k)$, respectively, and digitalized in analog/digital converters ADU. The thus obtained digital signals (word length of L bits) are fed as a real component signal $Z_R(k)$ and an imaginary component signal $z_I(k)$ to a signal processor PRK which generally again furnishes as its output signal a complex digital signal $w_R(k)$, $w_I(k)$. Signal processing in the processor must therefore be performed in the complex mode which requires much more powerful processors than real signal processing. The complex output signal $w_R(k)$, $w_I(k)$ can be converted, by digital-/analog conversion D/A, lowpass filtering TP and quadrature return conversion QRM, into a real value analog signal $s_A(t)$. A significant drawback of these arrangements is, as already explained, the bandwidth which is limited by the analog/digital converter stages.

Figure 1B:
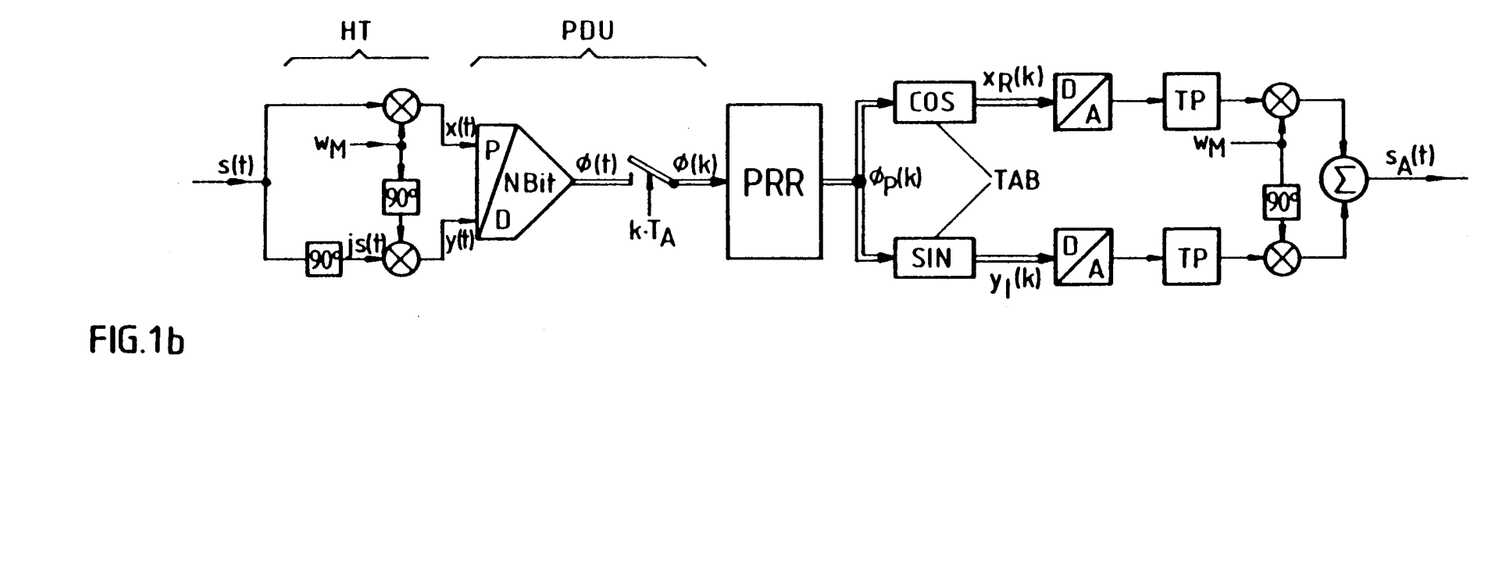

In the system outlined in FIG. 1b, a complex valued analog baseband signal having the components x(t) and y(t) is obtained in a Hilbert transformation stage from the real value analog input signal. Compared to quadrature conversion (FIG. 1a), Hilbert transformation has the advantage of being free from harmonics so that lowpass filters can be omitted. Otherwise, however, the generation of the complex baseband signals is of n further significance for the present invention. The essential difference between the system of FIG. 1b and the system sketched in FIG. 1a is the phase-digital converter PDU which puts out the momentary phases of the input signal with a resolution of N bits as a quasi time-continuous digital phase signal $\phi(t)$. This digital phase signal can be sampled at a very high clock pulse rate $k \cdot T_A$, i.e. at very short sampling intervals $T_A$, and can thus be converted into a time discrete succession of digital phase words $\phi(k)$. The signal sequence $\phi(k)$ is fed to signal processor PRR which emits, as its output signal, a further succession of digital phase words $\phi p(k)$. These phase words $\phi p(k)$ address a cosine and a sine memory table TAB so that again a complex digital signal $X_R(k)$, $y_R(k)$ is available which can be processed further in the same manner as the complex signal $w_R(k)$, $w_I(k)$ of FIG. 1a. Signal processor PRR need process only a real signal sequence $\phi(k)$ and can therefore be of simpler design or handle greater data rates than if it were to process complex signals.

In principle, any A/D conversion can be described completely in mathematical terms by integer divisions $$z = \operatorname{int} \frac{x}{q} \quad (3)$$

with x representing the analog input value and z the output word. The abbreviation "int" here represents the rounding or break operator for the integral representation of code word z. The divisor $$q = A_0 \cdot 2^{-N} \quad (4)$$

which is identical with the resolution of the A/D converter, is calculated from the control range $A_O$ of the A/D converter and the A/D converter word length N in bits.

This applies equally also for phase quantization. The phase angles $$\zeta(t) = \arctan \frac{y(t)}{x(t)} \quad (5)$$

of a complex time signal $$\underline{s}(t) = x(t) + jy(t) = A(t) \cdot e^{+j\zeta(t)} \quad (6)$$

(or the complex conjugate signal $$\underline{s}^*(t) = x(t) - jy(t) = A(t) \cdot e^{-j\zeta(t)}$$

obtained, for example, with the aid of a Hilbert transformation (see Reference /1/) from a purely real-value time signal s(t) (FIG. 1b), are quantized according to the basic formula for digital phase angle values $$\phi = \text{int}\left[\frac{\arctan y}{\theta}\right] \quad (7)$$

where the phase angle resolution should be set at $$\Theta = 2\Theta\pi 2^{-N} \quad (N = \text{binary digits in bits}) \quad (8)$$

Due to this "rounding off" of the phase angle according to Equation (7), a remainder $$\Delta\Theta = \zeta - \Theta\cdot\phi \quad (9)$$

is left which cannot be represented and which describes the systematic quantizing error of the phase quantizing process and, in the ideal case, moves between the limits $$-\frac{\theta}{2} \leq \Delta\theta \leq +\frac{\theta}{2} \quad (10)$$

However, the technical conversion of the phase quantization in this way is not always possible since in the case of x = 0 in the argument of the arc tan function in Equation (7) a division by zero will occur.

Figure 2:
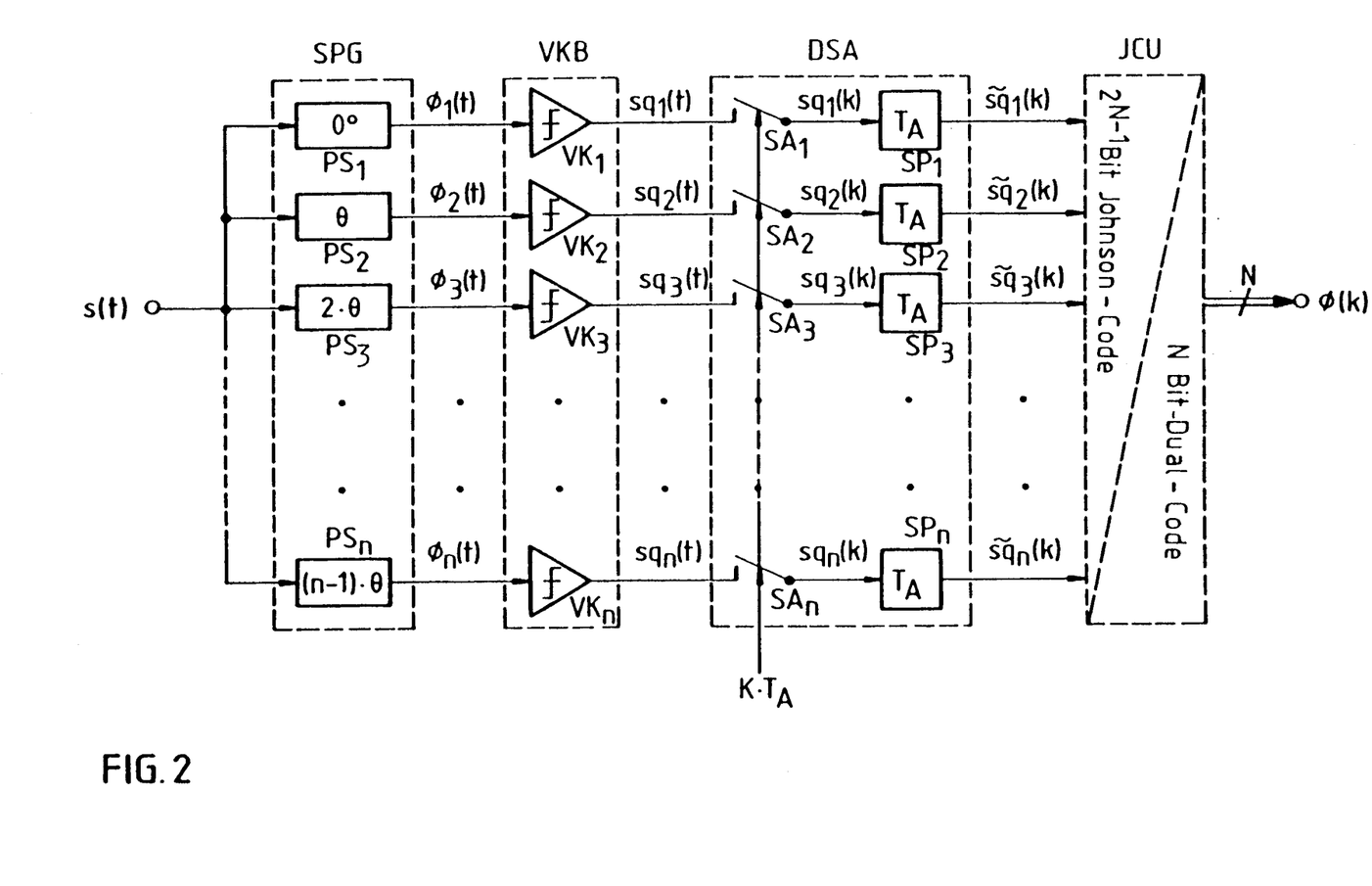
FIG. 2 depicts the basic structure of a phase-digital converter.

The principle of the method according to the invention is shown in FIG. 2.

In a signal phase generator SPG a set of signals is generated which are each shifted relative to one another and relative to the input signal, respectively, by the same phase increments Θ (Equation (8)) and by the phase angle $$\Theta_i = \Theta\cdot(i-1) \quad (11)$$

Figure 3:
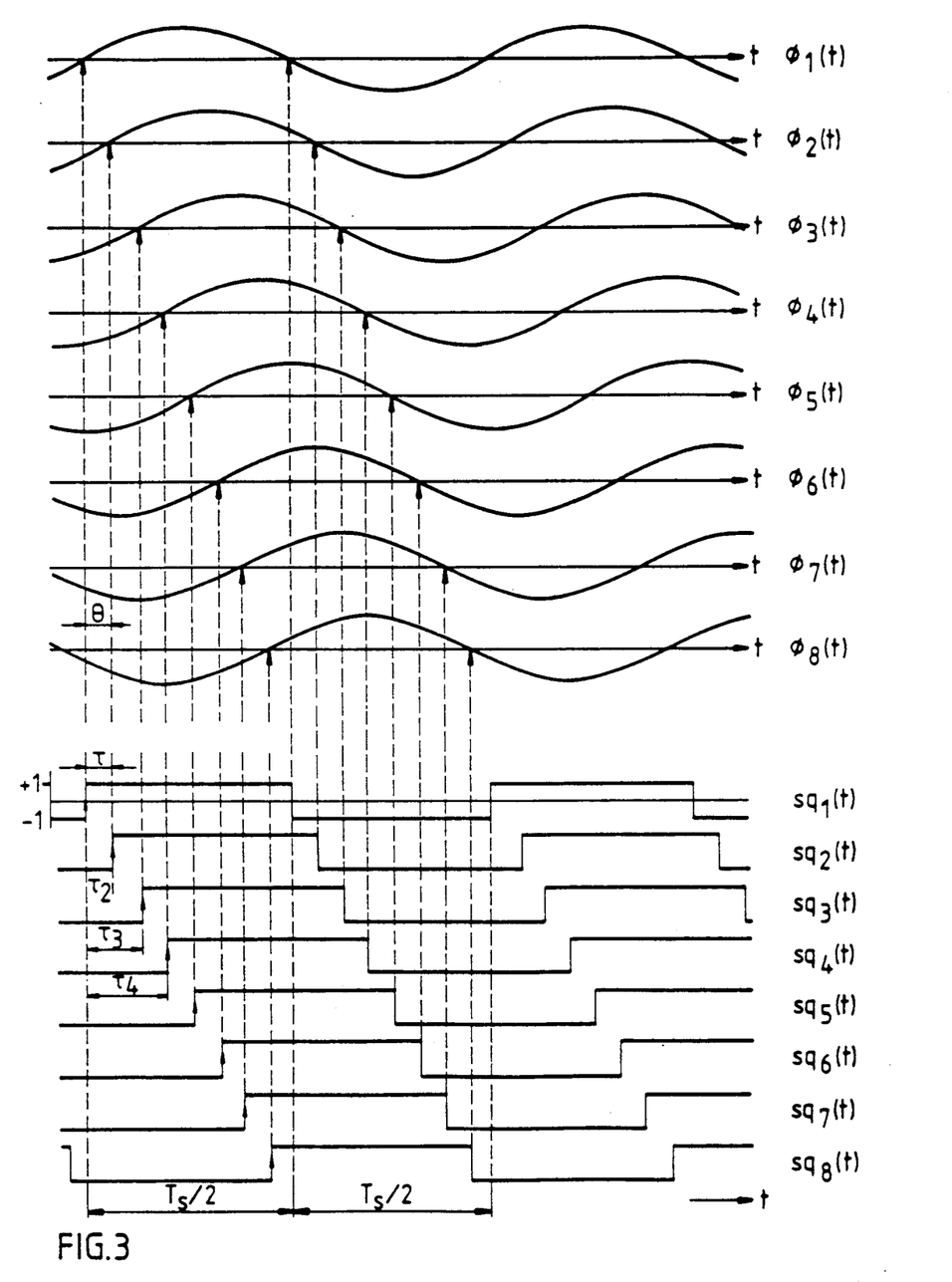
FIG. 3 gives an example of phase quantizing for a real input signal.

These signals, hereinafter called signal phases and expressed as follows $$\phi_i(t) = \text{Re}A(t)\cdot e^{j\zeta(t)}\cdot e^{-j\Theta_i} \quad (12)$$

or as real/imaginary components:

$$\phi_i(t) = a_i\cdot x(t) + b_i\cdot y(t) \quad (13)$$

where i = 1, 2, 3, . . . , n and n = $2^{N-1}$ are generated as indicated in FIG. 2 by the phase shifters PSI to PSn of signal phase generator SPG. Signal phase $\phi_1(t)$ is assumed not to have a phase shift relative to the input signal, i.e. $\phi_i(t) = s(t)$. Signal phases $\phi_i$ are applied to the inputs of sign comparators $VK_1$ to $VK_n$ of a sign comparator bank VKB which forms a set of Johnson sequences $sq_i(t)$ where i = 1, 2, . . . , n from signal phases $\phi_i$ according to the sgn (signum) function. Signal phases $\phi_1(t)$ to $\phi_8(t)$ which are formed by such a phase shift from a real input signal and the Johnson sequences $sq_1(t)$ to $sq_8(t)$ resulting therefrom are shown in FIG. 3. Johnson sequences are defined and described in detail in reference /2/.

In the real case, the signal phases are not generated by means of the phase shifting of a real input signal but by parallel vector additions of the real and imaginary components of the complex input signal ,uns/s/ (t) (Equation (6)). In order to obtain a phase shift $\downarrow_i$ i for the signal phase $\phi_i(t)$, the phase coefficients $a_i$ and $b_i$ from Equation (13) must meet the absolute condition $$\frac{b_i}{a_i} = \tan\theta_i \quad (14)$$

The rule expressed in Equation (14) is a significant feature of the phase-digital conversion method according to the invention and defines, in principle, the structure of signal phase generator SPG as will be described in detail below.

Figure 4:
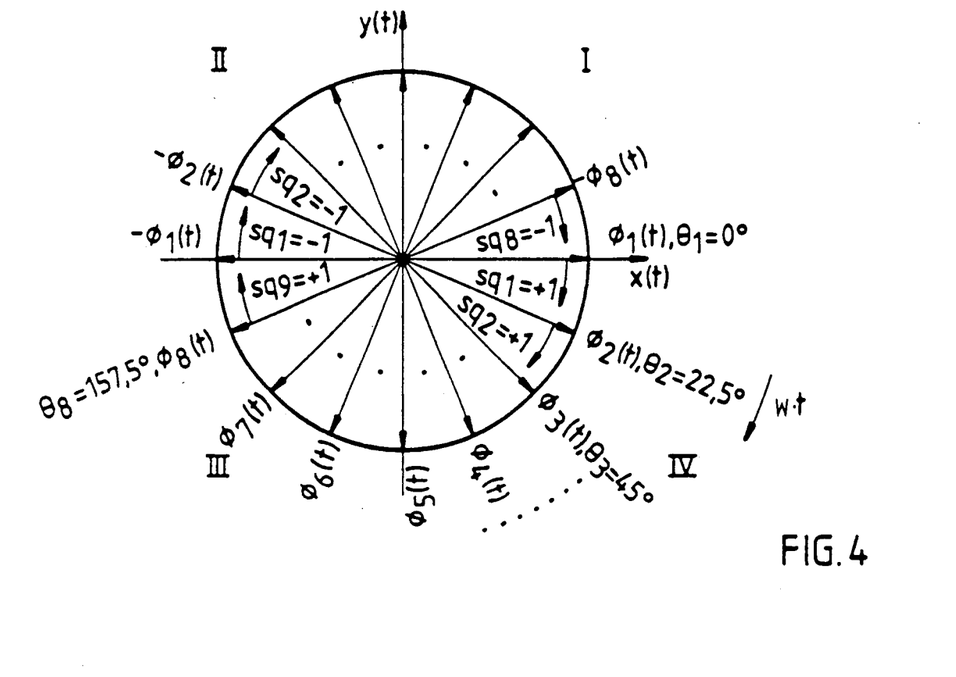
FIG. 4 gives an example of phase quantizing for a complex input signal.
Figure 5:
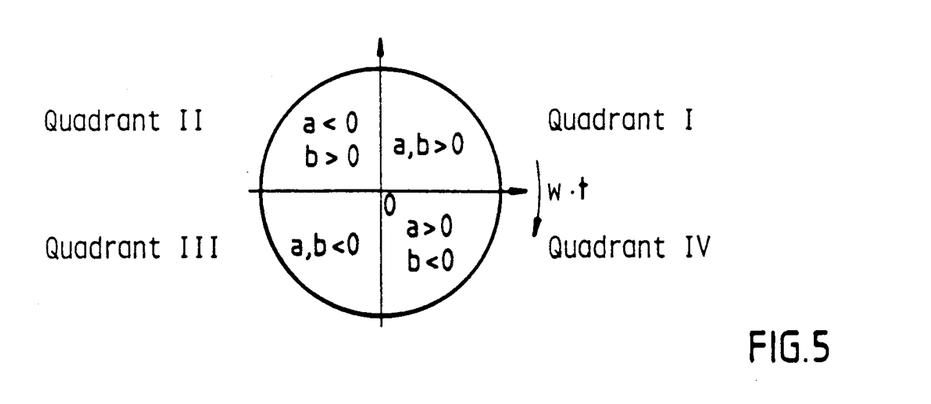
FIG. 5 gives the signs of the weighting coefficients employed.

FIG. 4 depicts the development of signal phases $\phi_i(t)$ from the components of the complex input signal with the aid of a vector diagram in the complex plane for the real component x(t) and the imaginary component y(t) of signal ,uns/s/ (t). In an exemplary case, N = 4 has again been selected to correspond to a phase angle resolution of 22.5 . Starting with the first signal phase $\phi_1$ which is not shifted in phase, corresponding to $\Theta_1 = 0°$, relative to the real input signal and the real component x(t) of the complex signal, the vectors of the phase shifted signal phases $\phi_2$, $\phi_3$, . . . to $\phi_8$ are each shifted clockwise by $\Theta = 22.5°$ in the lower half-space of the complex plane. This illustration also clearly shows that no further signal phases are required to subdivide the upper half-space and that it is merely necessary to invert signal phases $\phi_1$ to $\phi_8$. Also plotted in the diagram are changes in level of the associated sequences $sq_i(t)$ for rotation at the phase of input signal $\zeta(t) = w\cdot t$ From the diagram, by simple geometric considerations, the phase coefficients $a_i$, $b_i$ can also be derived by vector addition from the components x(t), y(t) to form signal phases $\phi_i$. The signs of the phase coefficients in the quadrants of the complex plane are shown in FIG. 5. The resulting Johnson sequences $sq_i(t)$ are shown in FIG. 3.

The set of n binary Johnson sequences $sq_i(t)$ already includes the momentary phase of the input signal in phase quantized form and thus constitutes a time-continuous digital signal. For the complete conversion into a form suitable for digital signal processing, the phase quantization is followed by phase value sampling at the sampling clock pulse $k\cdot t_A$ and the sampling rate $f_A = 1/T_A$. This digital sampling takes place in parallel in a digital sequence sampler DSA which is connected to the output of the sign comparator bank. The sampling is illustrated in FIG. 2 by switches $SA_1$ to $SA_n$ with subsequently connected clocked memory cells $SP_1$ to $SP_n$ (clock pulse sequence $T_A$). The digital sequence sampler may be realized very easily by fast D flip-flops or similar clocked memory cells. The sequence of the sampling values $sq_i(k)$ obtained during parallel sampling form time discrete sequences $sq_i(k)$. The values $sq_i(k)$ equal in time are the momentary digital phase values of the input signal present in the Johnson code. Advisably, a code converter JCU is connected to the output of the digital sequence sampler to convert the digital values which are present in the Johnson code with $2^{N-1}$ bit word lengths into a code better suitable for further processing, for example the binary code or the Gray code, with a word length of N bits and emits them as a sequence of digital phase values $\phi(k)$.

Thus, the quantized phase value $$\phi(t) = \begin{cases} sq_1(t) = sq\left(1, \dfrac{t}{T_s}\right) = \operatorname{sgn} \phi_1(t) \\ sq_2(t) = sq\left(2, \dfrac{t}{T_s}\right) = \operatorname{sgn} \phi_2(t) \\ \quad . \qquad \quad . \qquad \qquad . \\ \quad . \qquad \quad . \qquad \qquad . \\ \quad . \qquad \quad . \qquad \qquad . \\ sq_n(t) = sq\left(n, \dfrac{t}{T_s}\right) = \operatorname{sgn} \phi_n(t) \end{cases} \quad (15)$$

then results from the signal phases $\phi_i(t)$ each mutually shifted in phase by $\Theta$ and by application of the sign function sgn as a set of n parallel Johnson sequences $sq_1$ to $sq_n$ (FIG. 3), shifted in time by $\tau_i$ which, according to the rule for a single sequence period, must here be fixed as follows:

$$sq_i(t) = sq\left(i, \dfrac{t}{T_s}\right) = \begin{cases} 1 \text{ for } \tau_i \leq t < \tau_i + T_s/2 \\ -1 \text{ for } \tau_i + T_s/2 \leq t < \tau_i + T_s \\ 0 \text{ for } t < \tau_i \text{ or } t \geq \tau_i + T_s \end{cases} \quad (16)$$

and for the individual sequence repetitions $sq_1(k)$ to $sq_n(k)$ with $$sq_i(k) = sq_i(t) \cdot \delta_T(t) = \sum_{k=-\infty}^{\infty} sq_i\left(\dfrac{k \cdot t}{T}\right) \quad (17)$$

(where $\delta_T(t)$ = Dirac surge rate at the equidistant spacing T, T = sequence duration). The time shifts $$\tau_i = \dfrac{2\pi}{\Theta} \cdot T_s \cdot (i - 1) = T_s \cdot 2^{-N} \cdot (i - 1) \quad (18)$$

of the Johnson sequences $sq_i(t)$ and $sq_i(k)$, respectively, thus correspond to the phase shifts of signal phases $\phi_i(t)$ having a period duration $T_s$ by the angle $\Theta \cdot (i - 1)$.

Two particularly advantageous embodiments of phase-digital converters (PDU) operating with a phase angle resolution of 8 bits in the Johnson code or 4 bits in the binary or Gray code (N =4) for the realization of the phase-digital conversion method (PDC) according to the described basic principle of FIGS. 2, 3 and 4 will now be described. They differ essentially in the structures of their signal phase generators (SPG). The possibility of being able to configure the SPG's as fully monolithically integrated circuits in the conventional Si or GaAs technology is here a particular advantage. This means that the individual components of the SPG's themselves can be easily realized primarily by active components, e.g. transistors, differential amplifiers, etc.

It is here always assumed that a complex input signal, s(t) is involved which is obtained from a real signal s(t) by quadrature mixing or Hilbert transformation with a signal $e^{-j w_M t}$ and is present in the form of orthogonal signal components x(t) and y(t) (Equation (6)). The generation of the signal phases $\phi_1(t)$ to $\phi_8(t)$ takes place on the basis of vector addition (FIGS. 4 and 5) from the orthogonal signal components of the complex input signal.

The various embodiments of signal phase generators SPG each meet the unrestricted condition of the phase coefficients $a_i$ and $b_i$ of Equation (14). This equation fixes only the ratio of phase coefficient $b_i$ to phase coefficient $a_i$ and thus permits other freely selectable subconditions for the individual phase coefficients. This will be utilized in a special way in the examples to be described below.

For technical use it is advisable to permit phase coefficients $a_i$ and $b_i$ of Equation (13) to take on only values which are less than 1 in amount. In the SPG this produces signal amplifications $|V| \leq 1$ which can be realized particularly easily by means of integratable, passive or active components.

Figure 6:
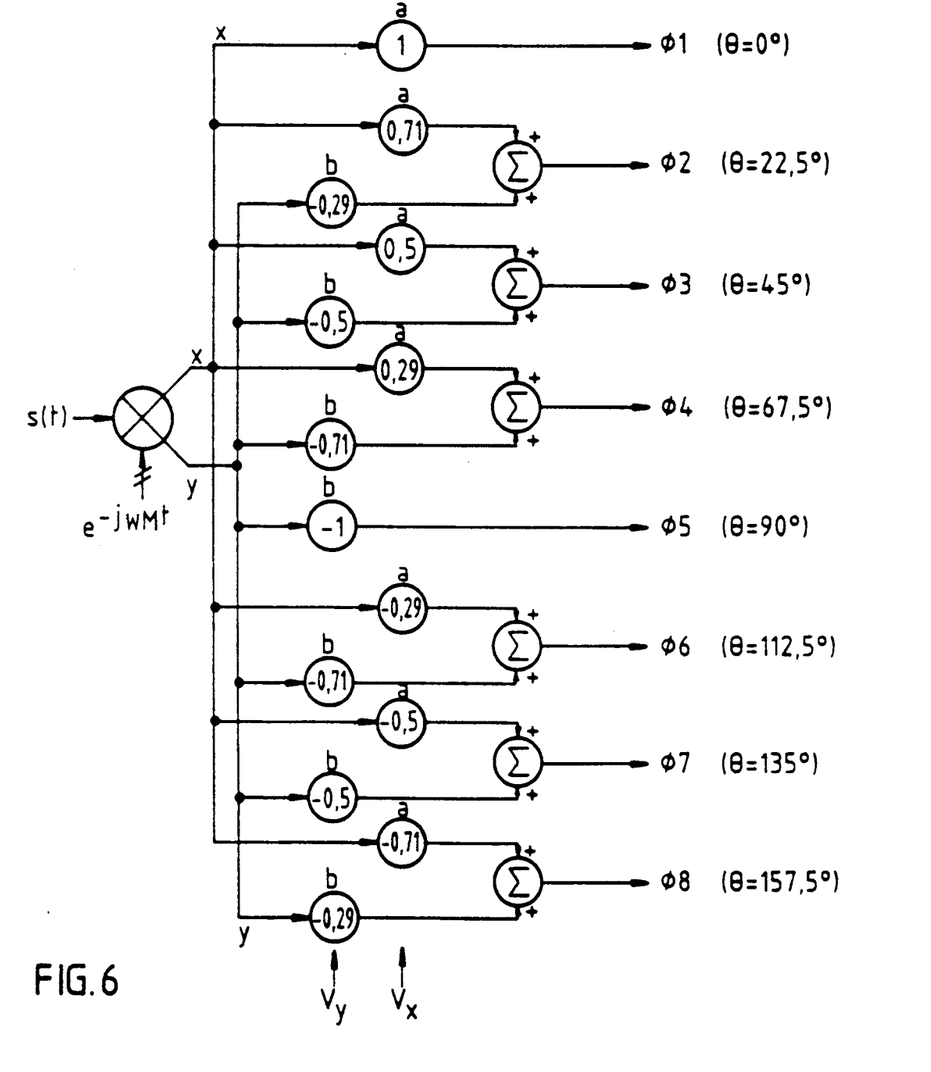
FIG. 6 gives an example for the generation of signal phases $\phi i$ for phase quantization.

In the case of the first example according to FIG. 6, a subcondition which does not adversely affect the principle of the method is assumed for the coefficients, namely:

$$|a_i| + |b_i| = 1 \quad (19)$$

From this result the equations for a determination of the phase coefficients as follows:

$$|a_i| = \dfrac{1}{1 + |\tan\theta_i|} \text{ and} \quad (20)$$

$$|b_i| = 1 - |a_i|$$

The respective signs for $a_i$ and $b_i$ within the individual quadrants of the phase quantization can here be found in FIG. 5.

According to these equations, the mathematical transfer model - a purely parallel fanning open of the signal paths of such an SPG is shown in FIG. 6 for P/D conversion with N =4. The signal delays from complex signal mixing to the individual signal summation points are here optimized, i.e. the individual parallel signals each traverse only one amplifier stage $V_x$ and $V_y$, respectively, with a gain of $|V_i| \leq 1$ ($V_i = a_i$ and $b_i$, respectively).

Figure 7:
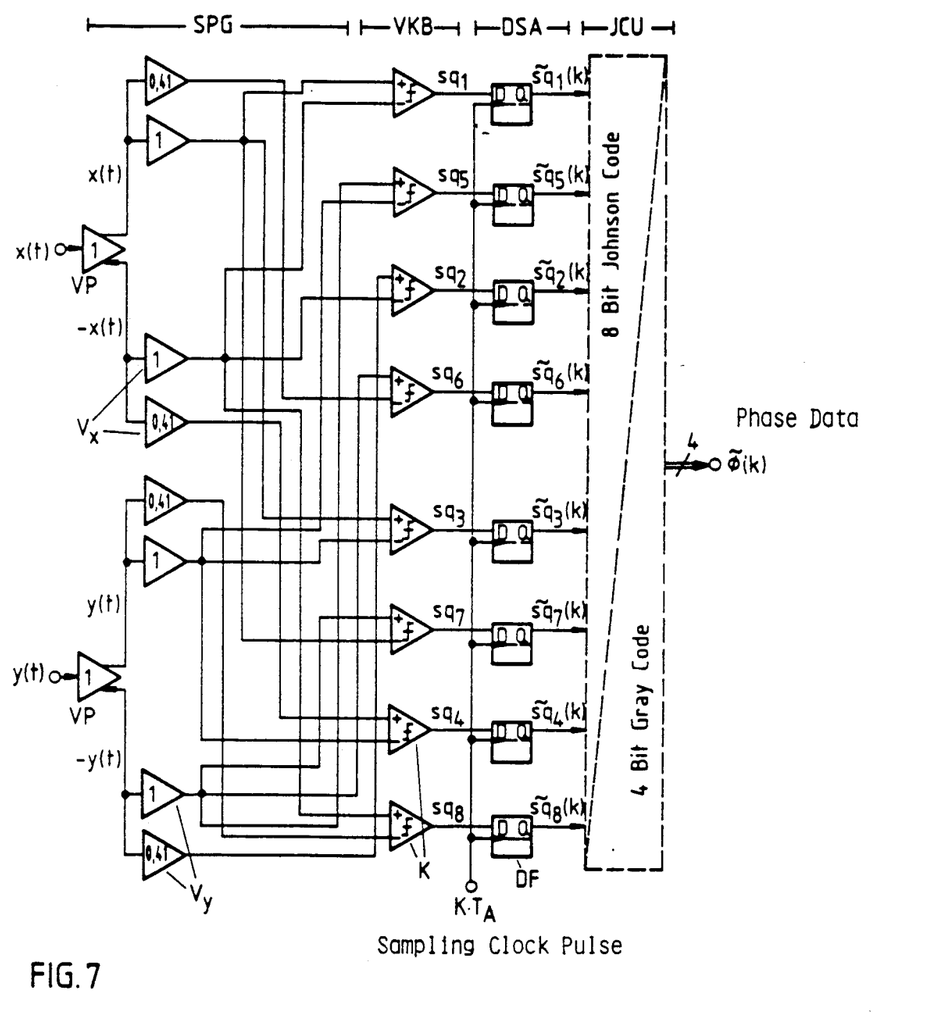
FIG. 7 an embodiment of a phase-digital converter.

The technical realization of the basic structure sketched in FIG. 6 takes advantage of the fact that the sum formations $\phi i = a_i x + b_i y$ provided in FIG. 6 can be replaced by difference formations $\phi i = a_i x - (-b_i y) = b_i y - (-a_i x)$ so that the summing members can be omitted and the difference formation performed instead takes place immediately ahead of the sign comparators in that the signal component $(-a_i x)$ or $(-b_i y)$, respectively, to be subtracted is applied to the inverting input of the respective comparator. The signal phases formed by vector addition will then not appear explicitly but vector additions and sign formation of the vector sums are then implied in the internal structure of the comparators. Moreover, the phase-digital converter according to FIG. 7 utilizes the fact that instead of weighting the signals with a negative coefficient, the signals x(t) and y(t) are advantageously conducted through amplifiers VP which have an additional inverting output and the inverted signal components are weighted with a positive coefficient. Weighting of the signals takes place in amplifier elements $V_x$ and $V_y$, respectively, whose amplification factors are shown in FIG. 7.

In deviation from FIG. 6, the coefficients resulting from Equation (20) are not used; instead the arrangement is designed in such a manner that only two amplification factors of different amounts occur. The condition of Equation (14) is of course also met in this embodiment. In order to uniformly load all outputs of amplifiers VP, a buffer amplifier P having a negative coefficient is additionally provided which, if such uniform loads are not desired, could also be connected with positive coefficient to the other output of the signal amplifier. Further embodiments which vary in details, particularly in weighting factors and combination, are also conceivable.

Digital sampling of Johnson sequences sql to sq8 available at the outputs of comparators VK is then advantageously done with the aid of D-flipflops DF actuated by the sampling clock pulse signal k·T$_A$. The phase values available in a Johnson Code having a width of 8 bits are converted in a Johnson code converter JCU into, for example, the 4-bit Gray code.

Figure 8:
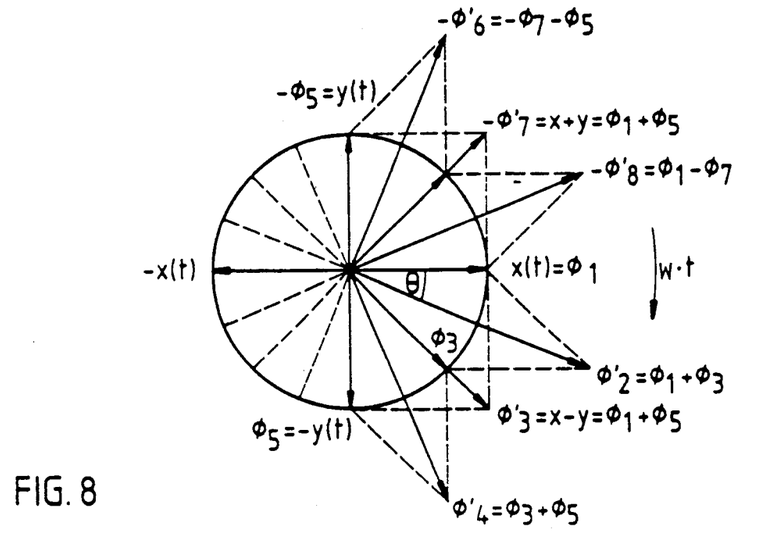
FIG. 8 the principle of successive phase angle halving by vector addition.
Figure 9:
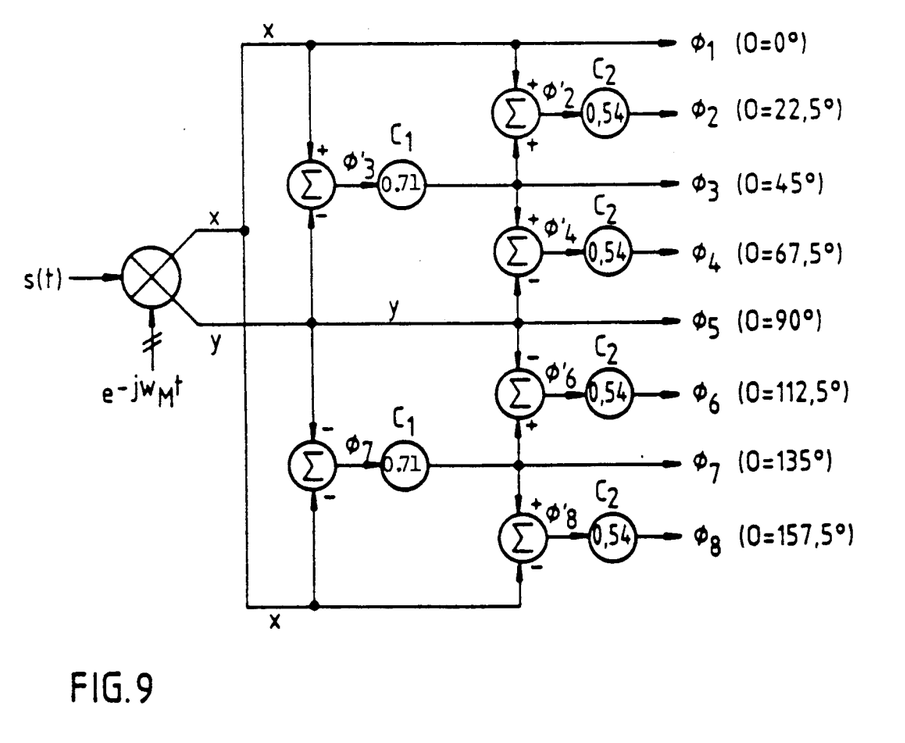
FIG. 9 depicts the generation of signal phases $\phi_i$ for phase to the phase angle halving principle.
Figure 10:
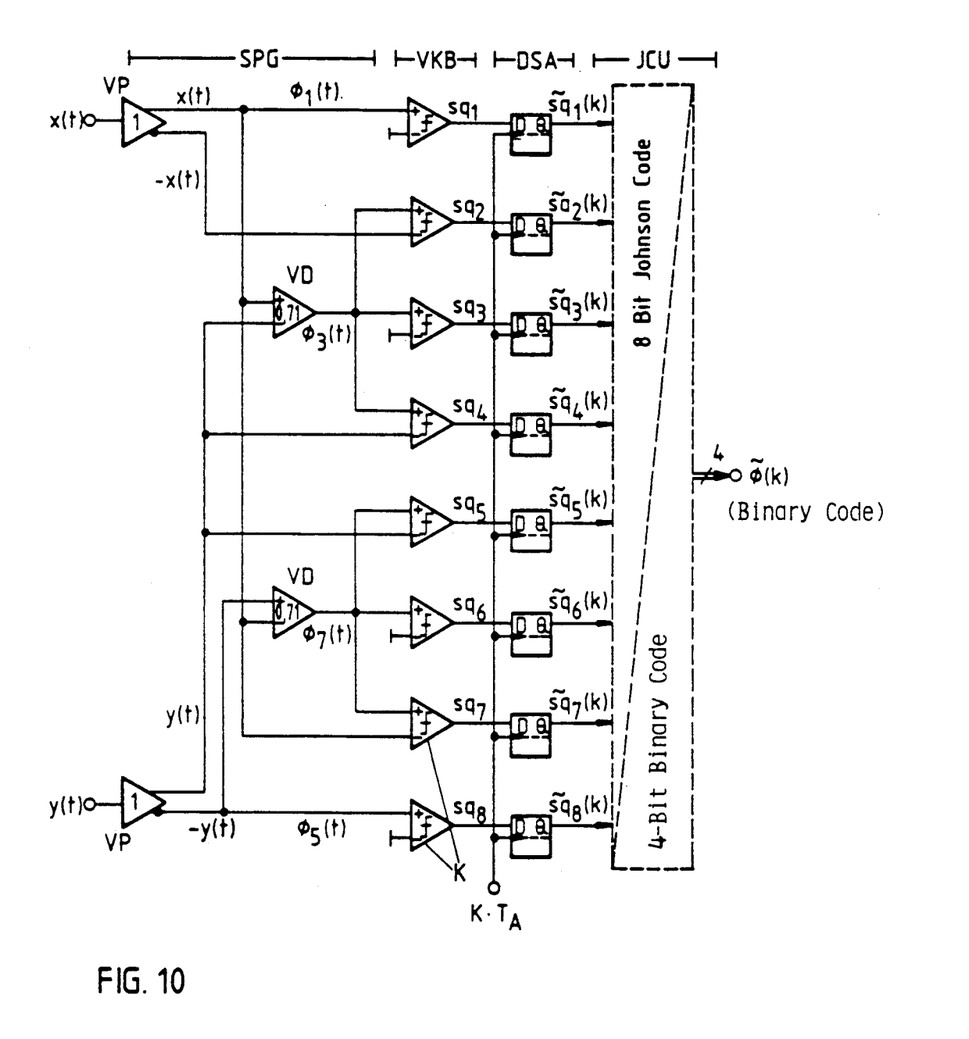
FIG. 10 depicts an embodiment of a phase-digital converter operating with phase angle halving.

In the case of the second example shown in FIGS. 8, 9 and 10, the signal phase generator (SPG) is realized in a different way, with of course the condition for the phase coefficients (Equation 14) being again fully met.

A significant difference compared to the basic structure of the signal phase generator sketched in FIG. 6 is the stepwise halving of the quantization phase angle by vector addition of the available signal phases into new signal phases having different phase delays. Starting with the orthogonal components x(t) and y(t) which can be considered to be signal phases of a first quantization stage having a phase angle resolution of $\pi/2$, new signal phases are formed by vector addition and their phase delays cut the phase angle resolution in half to $\pi/4$. The procedure continues in this way until the desired phase angle resolution has been attained. FIG. 8 shows the basic principle.

For a desired phase angle resolution of $\Theta = 2\pi \cdot 2^{-N}$, the invention provides that $2^{N-1}$ signal phases $\phi i(t)$ are to be formed. If $\phi i(t)$ is set to equal x(t), the further signal phase for N = 4 directly results as $\phi_5(t) = -y(t)$. These two signal phases produce a quadrant division of the complex plane corresponding to a phase angle resolutin of $\pi 2$. By vector addition in a subsequent step, further signal phases $\phi(t) = \phi_1(t) + \phi_5(t) = x(t) - y(t)$ and $\phi = 1(t)$ $\phi_5(t) = x(t) + y(t)$ are generated with which the complex plane is subdivided further into angle increments $\pi/4$ and thus the previous phase angle resolution is cut in half. While generally the orthogonal signal components x(t) and y(t) and signal phases $\phi_1(t)$ and $\phi_2(t)$, respectively, are identical in amplitude, the signal phases $\phi j$ and $\phi$have an amplitude which is higher by $\sqrt{2}$. Therefore, before the phase angle resolution is halved further in basically the same manner, the signal phases are standardized to the same amplitude in that $\phi 3$ and $\phi 7$ are weighted with a factor $$C_1 = \frac{1}{2\cos(\pi/4)} \approx 0.71$$

and are thus reduced in amplitude to the standardized signal phases $\phi 3$ and $\phi 7$ From the now available signal phases $\phi 1$, $\phi 3$, $\phi 5$ and $\phi 7$, vector addition produces new signal phases $\phi = \phi 1 + \phi 3$, $\phi = \phi 3 + \phi 5$, etc. which further halve the phase angle resolution to $\pi/8$ and are entered in the vector diagram of FIG. 8. Thus all signal phases required for the desired phase angle resolution with N =4 are available. Since only the signs of the signal phases are evaluated, the last signal phases formed, i.e. $\phi$, $\phi$and $\phi$, need not be standardized in amplitude. Only for the case that the phase angle resolution is to be further cut in half in an additional step, these signal phases are standardized in amplitude by weighting them with a scaling factor $$C_2 = \frac{1}{2\cos(\pi/8)} \approx 0.54$$

Thus, a binary tree structure as sketched in FIG. 9 results for the structure of a signal phase generator operating according to the described principle of successive halving of the phase angle resolution. The orthogonal signal components x(t) and y(t) are generated in the manner already described. Summing members ($\Sigma$) are shown which consider the signs for vector addition and scaling factors $C_1$ and $C_2$ for amplitude standardization. Since, as explained, scalings with $C_2$ are not required if the phase angle resolution is limited to that realized with $\phi_1$ to $\phi_8$, a tree structure results which is able to operate with a minimum of weighting coefficients. However, compared to the parallel fan structure (FIG. 6), this tree structure cannot be realized with a minimum of delay.

The same considerations as made for the phase-digital converter shown in FIGS. 6 and 7 can be utilized here for the technical realization of a phase-digital converter. In the structure of such a phase-digital converter shown in FIG. 10, inverted signals are additionally generated in amplifiers VP from the orthogonal input signal components x(t) and y(t). The signal phases $\phi_1(t)$ and $\phi_5(t)$ are applied directly to the inputs of the associated sign comparators. The vector additions including standardization to obtain the signal phases $\phi_3(t)$ and $\phi_7(t)$ are performed by means of differential amplifiers VD having their amplification factor set at V = $C_1$. The remaining vector additions for $\phi 2$, $\phi 4$, $\phi 6$ and $\phi 8$ together with the sign formation are moved, in the manner described in connection with FIG. 7, to comparators K. The further processing with sampling and code conversion, here to the 4-bit binary code, takes place analogously to the phase-digital converter of FIG. 7.

It will be understood that the above description of the present invention is susceptible to various modifications, changes and adaptations, and the same are intended to be comprehended within the meaning and range of equivalents of the appended claims.

BIBLIOGRAPHY

/1/ H. D. Luke, Signalubertragung, published by Springer Verlag, Third Edition, Berlin, Heidelberg, New York, Tokyo, 1985.

/2/ K. G. Beauchamp, Applications of Walsh and Related Functions with an Introduction to Sequency Theory, Academic Press, London, Orlando, San Diego, New York, Toronto, Montreal, Sidney, Tokyo, 1984.

/3/ G. Webber, J. Culp, M. Robinson, DRFM Requirements Demand Innovative Technology, Microwave Journal, February, 1986, pages 91-104.

What is claimed is:

1. In a method of converting an analog signal to a digital phase form in which an input signal s(t) = x(t) + jy(t) present in the form of orthogonal signal components x(t) and y(t) is converted with the use of a combination network and a plurality of comparators into a digital phase signal at outputs of the comparators, the improvement comprising the steps of:

for digital phase resolution to $2^N$ identical phase increments $\Theta = 2\pi \cdot 2^{-N}$, forming from the signal components x(t) and y(t) signal phases $\phi i(t) = [di \cdot x(t)]ai \cdot xi(t) + bi \cdot y(t)$ (where i = 1, 2, ... $2^{N-1}$)

which are shifted in phase by identical phase angles, wherein $a_i$ and $b_i$ are weighting coefficients with the relation $b_i/a_i = [\tan\Theta \cdot (i-1)]\tan\Theta_i$ where $\Theta i = (i-1)\Theta$; and evaluating the signs of the signal phases with the comparators to obtain digital phase signals $sq_i(t)$, wherein $sq_i(t) = sqn\phi_i(t)$, for $i = 1, 2, \ldots 2^{N-1}$.

2. Method according to claim 1, wherein is greater than 2, and said step of forming includes forming the signal phases $\phi_i$ in a plurality of successive stages, at least two of the signal phases being formed in a first stage, each signal phase of a remainder of the signal phases being derived in stages following the first stage as a scaled combination of signal phases derived in a preceding stage or preceding stages nd having a phase angle resolution which is one-half of the phase angle resolution of the preceding stage.

3. Method according to claim 2, further comprising the step of sampling the digital phase signals $sq_i(t)$ at a sampling rate which is at least equal to the bandwidth of the input signal $s(t)$ to obtain time discrete sequences $sq_i(k)$.

4. Method according to claim 1, further comprising the step of sampling the digital phase signals $sq_i(t)$ at a sampling rate which is at least equal to the bandwidth of the input signal $s(t)$ to obtain time discrete sequences $sq_i(k)$.

5. A method as in claim 1, further comprising the step of converting the phase signals $\phi_i(t)$ to a time discrete succession of digital phase words $\phi_i(k)$, said step of converting including the step of sampling the digital phase signals $sq_i(t)$ in parallel at a clock rate to obtain time discrete sequences $sq_i(k)$.

6. A method as in claim 5, further comprising the step of forming a Johnson code from the sequence $sq_i(k)$ and converting the Johnson code to another code constituting a single digital signal $\phi(k)$ corresponding to the analog signal $s(t)$.

7. A method as in claim 1, wherein the step of forming the signal phases $\phi_i(t)$ is performed by vector addition of the signal components $x(t)$ and $y(t)$.

8. A method as in claim 1, wherein the step of forming the signal phases $\phi_i(t)$ is performed by adding the weighted signal components $a_i \cdot x_i(t)$ and $b_i \cdot y_i(t)$ in the comparators.

9. Apparatus for converting an input signal $s(t) = x(t) + jy(t)$ in the form of orthogonal signal components $x(t)$ and $y(t)$ into a phase-digital form with a digital phase resolution of $2^N$ identical phase increments $\Theta = 2\pi 2^{-N}$, comprising:

a combination network having generating means, responsive to the orthogonal signal components $x(t)$ and $y(t)$, for generating, for each $i$, $i = 1, 2, \ldots, 2^{N-1}$, a pair of weighted signal components selected from a first pair of weighted signal components $a_i x(t)$ and $-b_i y(t)$ and a second pair of weighted signal components $-a_i x(t)$ and $b_i y(t)$, where $a_i$ and $b_i$ are weighting coefficients having values such that signal phases $\phi_i(t)$ given by $\phi_i(t) = a_i x(t) + b_i y(t)$ for $i = 1, 2, \ldots, 2^{N-1}$, are shifted in phase by the identical phase increments $\Theta$, with $a_i$ and $b_i$ having values such that $b_i/a_i = \tan \Theta_i$, $\Theta i = \Theta(i-1)$, said generating means including amplitude weighting members having respective inputs and outputs and means, responsive to the orthogonal signal components $x(t)$ and $y(t)$ at their inputs, for providing at their outputs the selected pair of weighted signal components $a_i x(t)$ and $-b_i y(t)$ or $-a_i x(t)$ and $b_i y(t)$, for each $i$, $i = 1, 2, \ldots, 2^{N-1}$, and means for applying the orthogonal signal components $x(t)$ and $y(t)$ to the inputs of the amplitude weighting members in parallel; and comparator means, responsive to the selected pair of weighted signal components $a_i x(t)$ and $-b_i y(t)$ or $-a_i x(t)$ and $b_i y(t)$ for each $i$, $i = 1, 2, \ldots, 2^{N-1}$, for providing for each $i$, $i = 1, 2, \ldots, 2^{n-1}$, a corresponding component $sq_i(t)$ of a digital phase signal which is indicative of the phase of the input signal $s(t)$, the component $sq_i(t)$ being indicative of the sign of $a_i x(t) + b_i y(t)$, said comparator means including $2^{N-1}$ comparators $VK_i$, one for each $i$, $i = 1, 2, \ldots, 2^{N-1}$, respectively corresponding to the signal phases $\phi_i(t)$, each comparator having a non-inverting input, an inverting input and an output, and means, for each $i$, $i = 1, 2, \ldots, $ to $2^{N-1}$ for applying respective ones of the selected pairs of weighted signal components to the non-inverting input and inverting input of the comparator $VK_i$, respectively, with any of the weighted signal components $-a_i x(t)$ and $-b_i y(t)$ being applied to the inverting input of the comparator $VK_i$ and any of the weighted signal components $a_i x(t)$ and $b_i y(t)$ being applied to the non-inverting input of the comparator $VK_i$, to obtain the component $sq_i(t)$ at the output of the comparator $VK_i$.

10. Apparatus according to claim 9, wherein said amplitude weighting members include:

a first amplifier having an input for receiving the signal components(t), inverting and non-inverting outputs and means, responsive to the signal component $x(t)$ at the input, for emitting an inverted signal component $-x(t)$ at the inverting output and the non-inverted signal component $x(t)$ at the non-inverting output, and a second amplifier having an input for receiving the signal component $y(t)$, inverting and non-inverting outputs and means, responsive to the signal component $y(t)$ at the input, for emitting an inverted signal component $-y(t)$ at the inverting output and the non-inverted signal component $y(t)$ at the non-inverting output.

11. Apparatus according to claim 9, wherein said amplitude weighting members are active amplification elements having given amplification factors.

12. Apparatus according to claim 11, wherein said amplitude weighting members include:

a first amplifier having an input for receiving the signal component $x(t)$, inverting and non-inverting outputs and means, responsive to the signal component $x(t)$ at the input, for emitting an inverted signal component $-x(t)$ at the inverting output and the non-inverted signal component $x(t)$ at the non-inverting output, and a second amplifier having an input for receiving the signal component $y(t)$, inverting and non-inverting outputs and means, responsive to the signal component $y(t)$ at the input, for emitting an inverted signal component $-y(t)$ at the inverting output and the non-inverted signal component $y(t)$ at the non-inverting output.

13. In an apparatus for converting a signal from an analog form to a digital phase form with a digital phase resolution of $2^N$ identical phase increments $\Theta = 2\Phi \cdot 2^{-N}$, $N>2$, in which an input signal $s(t)=x(t)+jy(t)$ present in the form of orthogonal signal components $x(t)$ and $y(t)$ is converted with a combination network and a plurality of comparators into a digital phase signal at outputs of the comparators, the improvement comprising:

forming means for forming from the signal components $x(t)$ and $y(t)$ signal phases $\phi i(t) = a_i \cdot x(t) + b_i \cdot y(t)$ (where $i=1, 2, \ldots, 2^{N-1}$) which are shifted in phase by identical phase angles, wherein ai and bi are weighting coefficients with the relation $b_i/a_i = \tan\Theta_i$ wherein $\Theta_i = (i-1) \cdot \Theta$; and means, including $2^{N-1}$ comparators, for evaluating the signs of the signal phases to obtain digital phase signals $sq_i(t)$, wherein $sq_i(t) = sgn\phi i(t)$ for $i=1, 2, \ldots, 2^{N-1}$;

said forming means forming the signal phases $\phi i(t)$ in a plurality of successive stages with at least two of the signal phases being formed in a first stage, and further of the signal phases being formed, in at least one further stage following the first stage, as a scaled combination of signal phases formed in a preceding stage or preceding stages, the signal phases formed in and prior to a further stage following the first stage providing a phase angle resolution which is one-half of the phase angle resolution provided in the preceding stage, said forming means including differential amplifiers within each further stage, the differential amplifiers within said each further stage having a same amplification factor.

14. Apparatus according to claim 13, wherein said forming means includes within said first stage:

a first amplifier having an input for receiving the signal component $x(t)$, inverting and non-inverting outputs and means, responsive to the signal component $x(t)$ at the input, for emitting an inverted signal component $-x(t)$ at the inverting output and the non-inverted signal component $x(t)$ at the non-inverting output, and a second amplifier having an input for receiving the signal component $y(t)$, inverting and non-inverting outputs and means, responsive to the signal component $y(t)$ at the input, for emitting an inverted signal component $-y(t)$ at the inverting output and the non-inverted signal component $y(t)$ at the non-inverting output.

15. An apparatus for converting an analog input signal $s(t)$ inot a digital phase signal $\phi(k)$ with a digital phase resolution of $2^N$ identical phase movements $\phi = 2\Phi \cdot 2^{-N}$, $N>2$, comprising:

(1) means for performing a Hilbert transformation on the signal $s(t)$ to obtain a complex input signal $s(t) = x(t) + jy(t)$;

(b 2) means, including $2^{N-1}$ comparators, for forming from the signal components $x(t)$ and $y(t)$ signal phases $\phi_i(t) = a_i \cdot x(t) + b_i \cdot y(t)$ (wherein $i=1, 2, \ldots, 2^{N-1}$)

which are shifted in phase by identical phase angles, wherein ai and bi are weighting coefficients with the relation $b_i/a_i = \tan\Theta_i$ wherein $\Theta_i = (i-1) \cdot \Theta$, and evaluating the signs of the signal phases to obtain digital phase signals $sq_i(t)$ at output ports of the comparators, wherein $sq_i(t) = sgn\phi_i(t)$ for $i=1, 2, \ldots, 2^{N-1}$;

(3) means for converting the phase signals $\phi i(t)$ to a time discrete succession of digital phase words $\phi i(k)$, said means of converting including means for sampling the digital phase signals $sq_i(t)$ in parallel at a clock rate to obtain time discrete sequences $sq_i(k)$; and (4) means for forming a Johnson code from the sequences $sq_i(k)$ and converting the Johnson code to another code constituting a single digital signal $\phi(t)$ corresponding to the analog signal $s(t)$l

* * * * *